(12) United States Patent
Cho et al.

(10) Patent No.: US 11,917,864 B2
(45) Date of Patent: Feb. 27, 2024

(54) STRETCHABLE DISPLAY DEVICE AND MANUFACTURING METHOD THEREOF

(71) Applicant: KOREA INSTITUTE OF SCIENCE AND TECHNOLOGY, Seoul (KR)

(72) Inventors: Sangho Cho, Seoul (KR); Kyung Youl Baek, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/698,334

(22) Filed: Mar. 18, 2022

(65) Prior Publication Data

US 2022/0302232 A1    Sep. 22, 2022

(30) Foreign Application Priority Data

Mar. 18, 2021   (KR) .......................... 10-2021-0035378

(51) Int. Cl.
*H01L 27/32* (2006.01)
*H10K 59/122* (2023.01)
*G06F 1/16* (2006.01)

(52) U.S. Cl.
CPC ......... *H10K 59/122* (2023.02); *G06F 1/1652* (2013.01); *G06F 1/1656* (2013.01); *C09K 2323/06* (2020.08)

(58) Field of Classification Search
None
See application file for complete search history.

(56) References Cited

U.S. PATENT DOCUMENTS

2016/0215394 A1\* 7/2016 Sung ................. G02F 1/133305
2018/0046221 A1\* 2/2018 Choi ..................... G06F 1/1637

FOREIGN PATENT DOCUMENTS

| JP | 2004-524396 A | 8/2004 |
|----|----|----|
| KR | 10-0477745 B1 | 3/2005 |
| KR | 20160060988 A | 5/2016 |
| KR | 10-2018-0018944 A | 2/2018 |
| KR | 101964876 B1 | 4/2019 |

OTHER PUBLICATIONS

Korean Office Action for KR Application No. 10-2021-0035378 dated Jan. 25, 2023.
Notice of Allowance dated Jul. 10, 2023, in corresponding KR Patent Application No. 10-2021-0035378, 4 pp.

\* cited by examiner

*Primary Examiner* — Anthony J Frost
(74) *Attorney, Agent, or Firm* — CANTOR COLBURN LLP

(57) ABSTRACT

Provided is a display device including a film structure having excellent flexibility and moisture infiltration prevention effects via a structure including a first polymer and a second polymer in which an inorganic compound penetrates into the first polymer. The display device may have excellent durability without causing problems such as peeling off of a sealing layer and moisture infiltration even after the display device is repeatedly stretched.

12 Claims, 7 Drawing Sheets

STRETCHABLE DISPLAY DEVICE AND MANUFACTURING METHOD THEREOF

TECHNICAL FIELD

The present invention relates to a stretchable display device and a method of manufacturing the stretchable display device.

BACKGROUND ART

Stretchable and flexible electronic devices have been expected as next-generation wearable, intelligent, and integrated electronic systems due to their torsional properties, foldability, bendability, compressibility, and non-planar surface properties. The paradigm of demands for rapidly growing display markets has shifted to super-elastic, stretchable devices beyond foldable electronic devices which have recently be commercialized. The market size of such stretchable devices for energy, medical, and military applications is expected to be about $763 million (USD) by 2023.

To meet such demands, devices including new components (e.g., mesh, serpentinite, wave shape, paper folding, and kirigami) capable of withstanding severe deformation are being developed. However, in comparison of simple bending or folding, about 10 times or more mechanical stress is applied to the front and rear surfaces of a display, and electrical and mechanical problems are easily caused when the display is stretched. Development of devices capable of withstanding such mechanical stress therefore remains a distant goal.

DISCLOSURE

Technical Problem

An object of the present invention is to provide a stretchable, flexible display device including a film structure having excellent effects on preventing moisture infiltration and excellent flexibility.

Technical Solution

An aspect of the present invention provides a stretchable display device including: a stretchable substrate including a pixel area and a non-pixel area; at least one pixel unit provided on the pixel area of the substrate; at least one bank unit provided on the non-pixel area of the substrate; and a sealing layer covering the pixel unit, wherein the substrate includes a first polymer provided with a polar functional group on chains thereof, and a composite of an inorganic compound and the first polymer is provided in the pixel area of the substrate by allowing the inorganic compound to selectively penetrate into the pixel area between the non-pixel area and the pixel area of the substrate and bind to the polar functional group on the chains of the first polymer.

According to an embodiment of the present invention, the bank unit may be provided between a plurality of the pixel units.

According to an embodiment of the present invention, the sealing layer may include the first polymer provided with the polar functional group on chains thereof, and the inorganic compound may penetrate into the sealing layer and bind to the polar functional group on the chains of the first polymer to form a composite of the inorganic compound and the first polymer covering the pixel unit.

According to an embodiment of the present invention, the bank unit may include a second polymer having a larger amount of a —C—C—, —C=C—, —CF$_2$—CF$_2$—, or —SiO— functional group than an amount of the polar functional group, and an amount of the inorganic compound contained in the bank unit may be lower than an amount of the inorganic compound contained in the sealing layer.

According to an embodiment of the present invention, the polar functional group of the first polymer may include at least one selected from the group consisting of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), and —C(O)NH—C(O)— (imide).

According to an embodiment of the present invention, the polar functional group of the first polymer may include a C=O bond in a molecule thereof, and the inorganic compound may be provided in the substrate via diffusion and reaction by penetrating into the substrate in an inorganic compound precursor form, and reacting with the C=O bond.

According to an embodiment of the present invention, the polar functional group of the first polymer may include an ether (—O—) bond in a molecule thereof, and the inorganic compound is provided via diffusion and reaction by penetrating into the substrate in an inorganic compound precursor form, and reacting with the ether (—O—) bond.

According to an embodiment of the present invention, the polar functional group of the first polymer may include a hydroxy (—OH) functional group, and the inorganic compound may be provided via diffusion and reaction by penetrating into the substrate in an inorganic compound precursor form, and reacting with the hydroxy (—OH) functional group.

According to an embodiment of the present invention, the polar functional group of the first polymer may include an amine (—NH$_2$) functional group, and the inorganic compound may be provided via diffusion and reaction by penetrating into the substrate in an inorganic compound precursor form, and reacting with the amine (—NH$_2$) functional group.

According to an embodiment of the present invention, the polar functional group of the first polymer may include a thiol (—SH) functional group, and the inorganic compound may be provided via diffusion and reaction by penetrating into the substrate in an inorganic compound precursor form, and reacting with the thiol (—SH) functional group.

Another aspect of the present invention provides a method of manufacturing a stretchable display device, the method including: a first step of providing a stretchable substrate including a pixel area and a non-pixel area; a second step of providing a bank unit on at least one portion of the non-pixel area of the substrate; a third step of allowing an inorganic compound to selectively penetrate into the pixel area of the substrate; a fourth step of providing a pixel unit on the pixel area of the substrate; a fifth step of providing a sealing layer covering the pixel unit; and a sixth step of allowing an inorganic compound to penetrate into the sealing layer, wherein the substrate includes a first polymer provided with a polar functional group on chains thereof, and a composite of an inorganic compound and the first polymer is provided in the pixel area of the substrate by allowing the inorganic compound to selectively penetrate into the pixel area between the non-pixel area and the pixel area of the substrate and bind to the polar functional group on the chains of the first polymer.

According to an embodiment of the present invention, the first polymer may have a larger amount of the polar functional group than an amount of a —C—C—, —C=C—, —CF$_2$—CF$_2$—, or —SiO— functional group, a second polymer provided in the bank unit may have a larger amount of a —C—C—, —C=C—, —CF$_2$—CF$_2$—, or —SiO— functional group than an amount of the polar functional group, and an amount of the inorganic compound provided in the second polymer may be lower than an amount of the inorganic compound provided in the first polymer.

Another aspect of the present invention provides a stretchable display device including: a stretchable substrate; one or more pixel units sequentially arranged on the substrate; a first sealing layer provided between the substrate and the pixel units; and a second sealing layer covering the pixel units, wherein the first sealing layer and the second sealing layer are provided in a form exposing at least one portion of the substrate, each of the first sealing layer and the second sealing layer include: a polymer layer including a first polymer having a polar functional group on chains thereof; and an inorganic compound penetrating into the polymer layer in a thickness direction thereof, and the inorganic compound binds to the polar functional group on the chains of the first polymer to be provided on the chains of the first polymer in the polymer layer.

Another aspect of the present invention provides a method of manufacturing a stretchable display device, the method including: a first step of providing a substrate; a second step of forming a first sealing layer by providing a first polymer film on the substrate and allowing an inorganic compound to penetrate into the first polymer film; a third step of providing a pixel unit on the first sealing layer; a fourth step of forming a second sealing layer by providing a second polymer film covering the pixel unit, and allowing an inorganic compound to penetrate into the second polymer film, the first sealing layer and the second sealing layer is provided in a form exposing at least one portion of the substrate, and each of the first sealing layer and the second sealing layer includes: a polymer layer including a first polymer having a polar functional group on chains thereof; and the inorganic compound penetrating into the polymer layer in a thickness direction thereof, wherein the inorganic compound binds to the polar functional group on the chains of the polymer layer to be provided between the chains of the polymer layer.

Advantageous Effects

According to an embodiment of the present invention, a display device including a film structure having excellent flexibility and moisture infiltration prevention effects may be provided and the display device may have excellent durability without causing problems such as peeling off of a sealing layer and moisture infiltration even after the display device is repeatedly stretched.

In addition, according to an embodiment of the present invention, because an area of a substrate provided a pixel has the ability to prevent moisture infiltration by selective penetration of an inorganic compound, infiltration of moisture into the pixel through the substrate may be prevented. Also, since the area having the ability to prevent moisture infiltration is provided integrally with the substrate, there is no risk of peeling off the area having the ability to prevent moisture infiltration even when the device is stretched. Furthermore, since the area having the ability to prevent moisture infiltration is less stretchable, damage to the pixel provided on the substrate and the sealing layer covering the pixel may be prevented while the display device is stretched.

MODE FOR INVENTION

Figure 1:
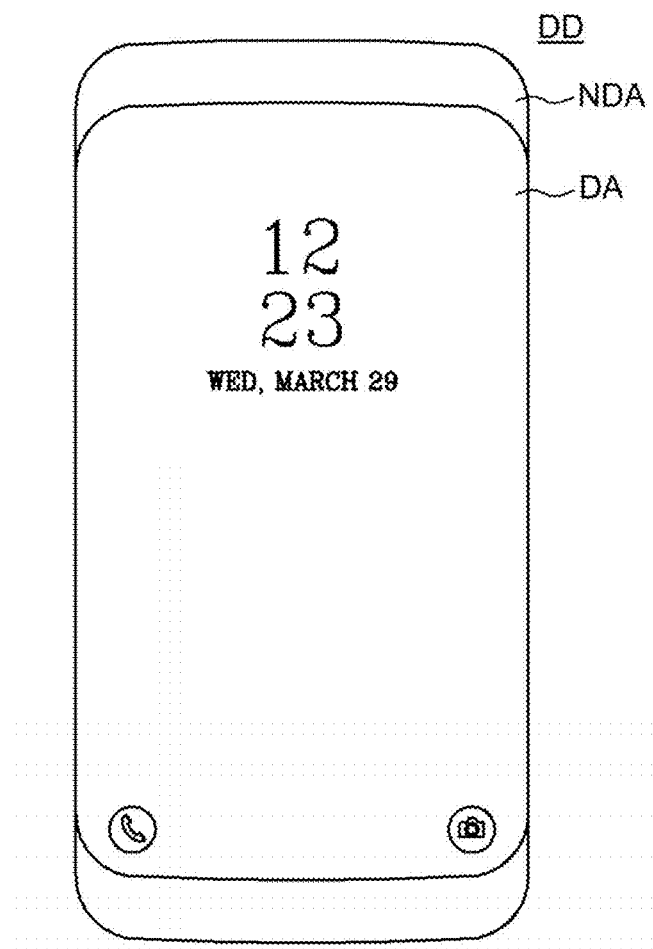
FIG. 1 is a plan view illustrating a display device according to an embodiment of the present invention.

While the present invention is susceptible to various modifications and alternative forms, specific embodiments thereof are shown by way of example in the drawings and will herein be described in detail. It should be understood, however, that the description herein of specific embodiments is not intended to limit the invention to the particular embodiment disclosed, but on the contrary, the intention is to cover all modifications, equivalents, and alternatives falling within the spirit and scope of the invention.

In the drawings, like reference numerals denote like elements. In the accompanying drawings, size of components is enlarged for clarity of the present invention. It will be understood that although the terms first, second, etc. may be used herein to describe various components, these components should not be limited by these terms. These terms are only used to distinguish one component from another. For example, a first component discussed below could be termed a second component, and similarly, the second component may be termed the first component without departing from the scope of the present invention. An expression used in the singular encompasses the expression of the plural unless it has a clearly different meaning in the context.

As used herein, the term "include" or "have" is intended to indicate the existence of the features, numbers, operations, components, parts, or combinations thereof disclosed in the specification, and are not intended to preclude the possibility that one or more other features, numbers, operations, components, parts, or combinations thereof may exist or may be added. Also, it will be understood that when one element such as layer, film, region, or plate, is referred to as being "on" another element, it may be "directly on" the other element, or intervening elements may also be present therebetween. In addition, throughout the specification, when one element such as layer, film, region, or plate is referred to as being on another element, a formation direction is not limited to an upward direction but may include lateral and downward directions. In contrast, when one element such as layer, film, region, or plate is referred to as being "under" another element, it may be "directly under" the other element, or intervening elements may also be present therebetween.

Throughout the specification, the "upper surface" and "lower surface" are used as relative concepts for easy understanding of the technical conception of the present invention. Therefore, the "upper surface" and "lower surface" do not indicate particular directions, positions, or components and may be used interchangeably. For example, an "upper surface" may be interpreted as a "lower surface" and the "lower surface" may be interpreted as the "upper surface". Therefore, the "upper surface" may be termed "first" and the "lower surface" may be termed "second", and the "lower surface" may be termed "first" and the "upper surface" may be termed "second". However, in one embodiment, the "upper surface" and the "lower surface" are not used interchangeably.

A display device according to an embodiment of the present invention includes a sealing layer including a polymer layer into which an inorganic compound penetrates, thereby having excellent flexibility and ability to prevent moisture infiltration. Thus, display devices having excellent durability may be provided. Hereinafter, the display device according to an embodiment of the present invention will be described in detail.

Figure 2:
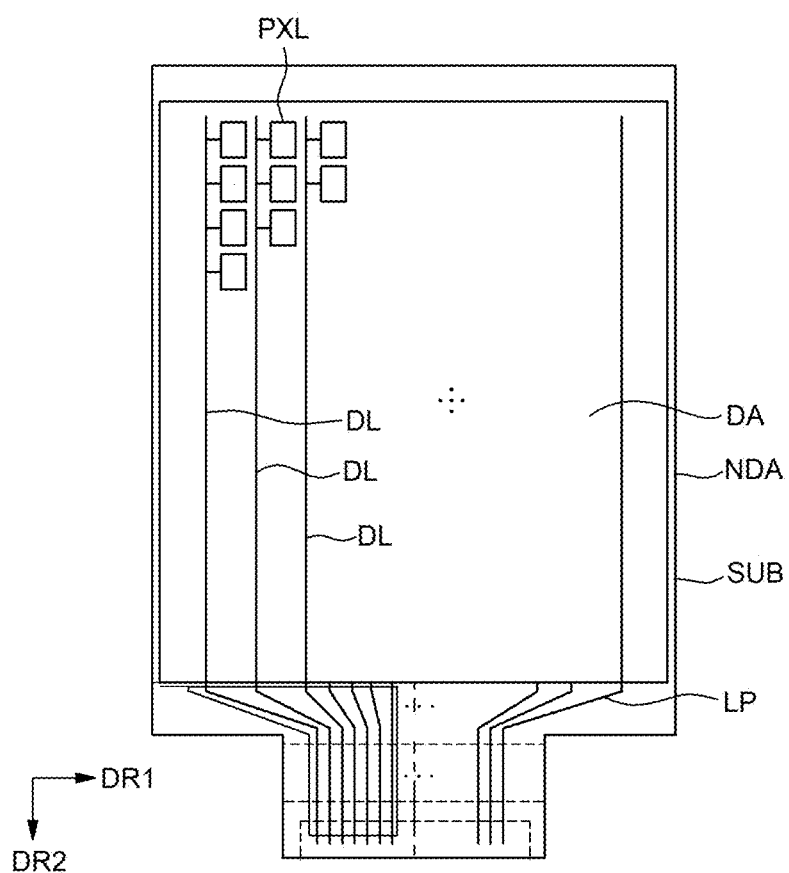
FIG. 2 is a plan view illustrating an inner structure of the display device of FIG. 1.

FIG. 1 is a plan view illustrating a display device according to an embodiment of the present invention. FIG. 2 is a plan view illustrating an inner structure of the display device of FIG. 1.

A display device DD of the present invention may include a display area DA and a non-display area NDA. The display area DA may include a plurality of pixels and an image may be output in the display area DA. The display area DA may be provided in various shapes such as a closed polygon with straight sides, a circle or ellipse with a curved side, and a semicircle or semiellipse with a straight side and a curved side. In an embodiment of the present invention, the display area DA may be provided in a rectangular shape with curved corners.

The non-display area NDA may be disposed on one side of the display area DA. Referring to FIG. 1, the non-display area NDA may be provided only on an upper side or lower side of the display area DA, but the arrangement of the display area DA and the non-display area NDA is not limited thereto. Therefore, if required, the arrangement of the display area DA and the non-display area NDA may be changed.

The display area DA is an area where a plurality of pixel units PXL are provided to display an image. The display area DA may be provided in a shape corresponding to a shape of the substrate SUB. For example, like the substrate SUB, the display area DA may be provided in various shapes such as a closed polygon with straight sides, a circle or ellipse with a curved side, and a semicircle or semiellipse with a straight side and a curved side. In an embodiment of the present invention, when the display area DA has straight sides, at least some of the corners of each shape may be provided in curved lines.

The pixel unit PXL is provided on the display area DA of the substrate SUB. Each pixel unit PXL is a minimum unit for displaying an image and the pixel unit PXL may be provided in plural numbers. The pixel unit PXL may emit white light and/or colored light. Each pixel unit PXL may emit any one of red color, green color, and blue color, but is not limited thereto, and may emit other colors such as cyan, magenta, and yellow.

The pixel unit PXL may be a light-emitting device including an organic light-demitting layer, but is not limited thereto, and may be implemented in various forms such as a liquid crystal device, an electrophoretic device, and an electrowetting device, within the scope of the present invention.

In an embodiment of the present invention, the non-display area NDA may further include an additional area protruding from a portion thereof. The additional area may protrude from sides of the non-display area NDA. In an embodiment of the present invention, an additional area protruding from a side corresponding to one shorter side of the substrate SUB is disclosed. However, the additional area may protrude from one longer side or may be provided in a shape protruding from two or more sides among the four sides. In an embodiment of the present invention, a data drive unit may be provided or connected to the additional area, but the embodiment is not limited thereto, and various elements may be disposed therein.

In an embodiment of the present invention, at least a part of the display device of the present invention may have flexibility, and the display device may be bent at a portion having flexibility. That is, the display device may have a bent area having flexibility and bent in one direction and a flat area provided on at least one side of the bent area and being flat without being bent. The flat area may or may not have flexibility.

The substrate SUB may have an approximately tetragonal shape, particularly, a rectangular shape. In an embodiment of the present invention, the substrate SUB may have a pair of shorter sides parallel to each other in a first direction DR1 and a pair of longer sides parallel to each other in a second direction DR2. In the present embodiment, the sides of the substrate SUB are referred to as first side S1 to fourth side S4 sequentially connected from one shorter side for descriptive convenience.

However, the shape of the substrate SUB is not limited thereto and the substrate SUB may have various shapes. For example, the substrate SUB may be provided in various shapes such as a closed polygon with straight sides, a circle or ellipse with a curved side, and a semicircle or semiellipse with a straight side and a curved side. In an embodiment of the present invention, when the substrate SUB has straight sides, at least some of the corners of each shape may be provided in curved lines. For example, when the substrate SUB has a rectangular shape, a portion where adjacent straight sides meet may be replaced with a curved line having a predetermined curvature. That is, vertices of the rectangular shape may be formed of curved sides having a predetermined curvature, both ends of each curved side connected to two adjacent straight sides. The curvature may be set differently in accordance with a position. For example, the curvature may vary in accordance with a position where a curve is started and a length of the curve.

A wiring unit LP includes data lines DL and connects a drive unit to the pixel unit PXL. The data lines DL may connect the pixel unit PXL to the drive unit and may extend from the pixel unit PXL approximately in the second direction DR2 for this connection. The data lines DL may extend to a pad area that is an end of the second direction DR2 of the additional area, and contact electrodes may be provided at the end. The pixel unit PXL may be connected to the drive unit implemented as a chip-on-film via the contact electrodes connected to wirings.

Figure 3:
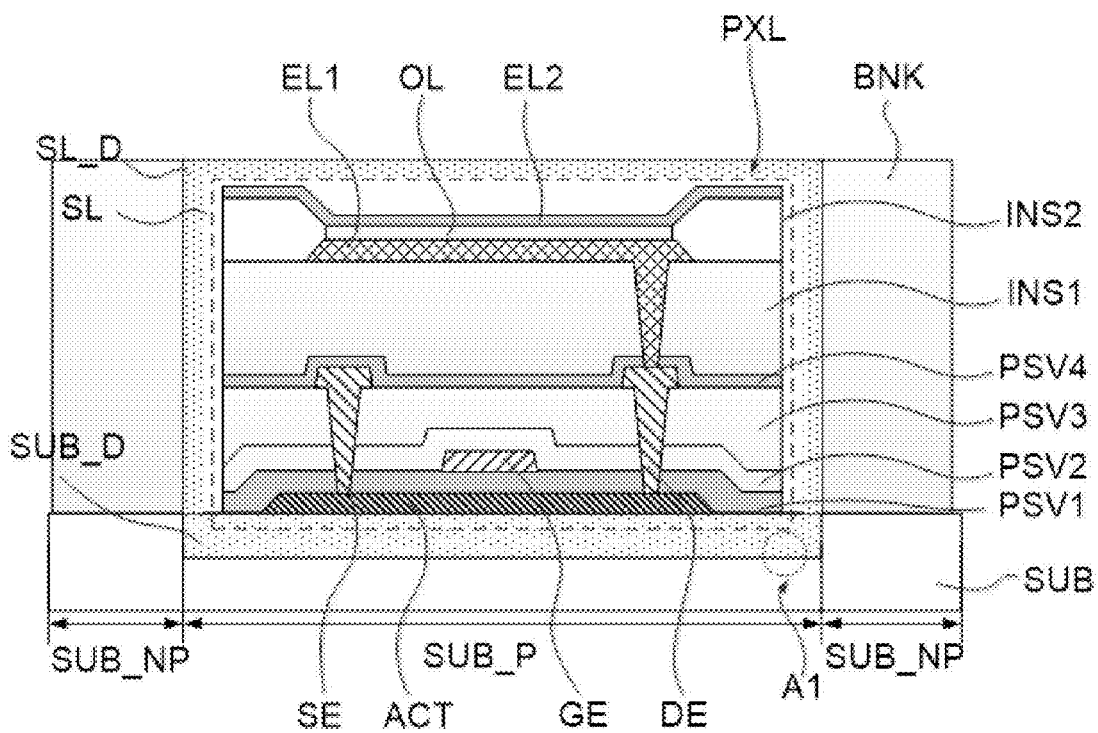
FIG. 3 is an enlarged sectional view of a display device according to an embodiment of the present invention.

FIG. 3 is an enlarged sectional view of a display device according to an embodiment of the present invention.

First, a substrate SUB is provided to support the display device. The substrate SUB may be formed of an insulating material such as glass or resin. In addition, the substrate SUB may be formed of a flexible material to be bent or folded. Thus, as well as the bent area provided in the not-display area of the substrate SUB, other areas of the substrate SUB may be bent or folded. For example, the display area provided with the pixel unit PXL may be bent or folded. In addition, the substrate SUB may have a single layer or multilayer structure.

The substrate SUB may include a first polymer. The first polymer refers to a polymer in which a chain is provided with a polar functional group. In this regard, the polar functional group may include at least one selected from the group consisting of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), and —C(O)NH—C(O)— (imide). In addition, in a molecule of the first polymer, an amount of a —C—C—, —C=C—, or —CF$_2$—CF$_2$— functional group may be less than that of the above-described polar functional group. The above-described first polymer may include, for example, at least one selected from the group consisting of polyethylene terephthalate (PET), polyimide (PI), and Nylon 6.

The substrate SUB includes a pixel area SUB_P and a non-pixel area SUB_NP. The pixel area SUB_P may refer to an area provided with the pixel unit PXL, and the non-pixel area SUB_NP may refer to an area provided with a bank unit BNK. However, the pixel area SUB_P of the substrate SUB is not necessarily identical to the pixel unit PXL on a plane, and a planar size of the pixel area SUB_P may be greater than a planar size of the pixel unit PXL. In addition, the non-pixel area SUB_NP is not necessarily identical to the bank unit BNK on the plane.

The substrate SUB may further include a layer in which an inorganic compound penetrates into the first polymer. In this case, the inorganic compound may be fixed by the polar functional group of the first polymer. Specifically, a binding force due to a covalent bond, a hydrogen bond, a dipole bond, or the like may be provided between the polar functional group of the polymer chain and the inorganic compound.

Penetration of the inorganic compound into the substrate SUB may selectively be performed in the pixel area SUB_P such that the inorganic compound is provided in the first polymer in the pixel area SUB_P. In this regard, providing the inorganic compound selectively into the pixel area SUB_P does not mean that no inorganic compound is provided into the non-pixel area SUB_NP of the substrate SUB. For example, the selectively providing the inorganic compound into the pixel area SUB_P may mean that an amount of the inorganic compound provided into the non-pixel area SUB_NP may be far less than an amount of the inorganic compound provided into the pixel area SUB_P.

Regarding a penetration form of the inorganic compound into the pixel area SUB_P of the substrate SUB, the inorganic compound may be provided only into a portion of the substrate SUB in a thickness direction. Specifically, as shown in the drawings, when a penetrated layer of the substrate SUB_D formed via linkage between the inorganic compound and the first polymer is viewed in the cross-section of the substrate SUB, the penetrated layer of the substrate SUB_D may be formed only to a predetermined penetration depth from the upper surface of the substrate SUB provided with the pixel unit PXL and may not be provided to the rear surface of the substrate SUB. A thickness of the penetrated layer of the substrate SUB_D may vary according to the type of the first polymer, the type of the inorganic compound, or the like.

Because the penetrated layer of the substrate SUB_D provided in the pixel area SUB_P of the substrate SUB is provided to the predetermined penetration depth from the upper surface of the substrate SUB, infiltration of moisture into the pixel unit PXL through the rear surface of the substrate SUB may be prevented. In addition, since the penetrated layer of the substrate SUB_D is provided as a part of the entire substrate SUB not to be separated therefrom, there is no risk of peeling off of the penetrated layer of the substrate SUB_D even when the substrate SUB having flexibility is stretched. Particularly, the pixel area SUB_P having a high content of the inorganic compound due to the penetrated layer of the substrate SUB_D is less stretchable compared to the non-pixel area SUB_NP having a low content of the inorganic compound not provided with the penetrated layer of the substrate SUB_D, and therefore it is possible to prevent the pixel unit PXL provided on the substrate SUB from being excessively stretched and damaged during a process of stretching the substrate SUB. That is, because a stress caused when the substrate SUB is stretched is dispersed into the non-pixel area SUB_NP, damage to the pixel unit PXL provided on the pixel area SUB_P may be prevented.

The pixel unit PXL is provided on the substrate SUB. The pixel unit PXL may include a transistor and a light-emitting unit and emit light in accordance with an applied signal.

First, an active pattern ACT may be provided in the pixel unit PXL. The active pattern ACT is formed of a semiconductor material. The active pattern ACT may include a source region, a drain region, and a channel region provided between the source region and the drain region. The active pattern ACT may be a semiconductor pattern formed of polysilicon, amorphous silicon, and a silicon semiconductor. The channel region, as a semiconductor pattern that is not doped with an impurity, may be an intrinsic semiconductor. The source region and the drain region may be semiconductor patterns doped with impurities. The impurities may be an n-type impurity, a p-type impurity, and an impurity such as metal.

A first passivation layer PSV1 is provided on the active pattern ACT. The first passivation layer PSV1 may be an inorganic insulating film formed of an inorganic material or an organic insulating film formed of an organic material. As the inorganic material, an inorganic insulating material such as polysiloxane, silicon nitride, silicon oxide, and silicon oxynitride may be used. The organic material may be an organic insulating material such as a polyacrylic compound, a polyimide-based compound, a fluorine-based carbon compound such as Teflon, and a benzocyclobutene compound.

A gate electrode GE is provided on the first passivation layer PSV1. The gate electrode GE may be formed to cover a region corresponding to the channel region of the active pattern ACT.

The gate electrode GE may be formed of a metal. For example, the gate electrode GE may be formed of at least one metal such as gold (Au), silver (Ag), aluminum (Al), molybdenum (Mo), chromium (Cr), titanium (Ti), nickel (Ni), neodymium (Nd), and copper (Cu), or an alloy of metals. In addition, the gate electrode GE may be formed as a single layer, but is not limited thereto, and may also be formed as a multilayer in which two or more materials selected from metals or alloys.

In an embodiment of the present invention, although not shown in the drawings, other lines, as well as the gate lines, may be provided on the same layer as that of the gate electrode GE using the same material. In this regard, the other lines, like the gate lines, may be directly or indirectly connected to a part of the transistor in each pixel unit PXL, e.g., the gate electrode GE.

A second passivation layer PSV2 may be provided on the gate electrode GE and a capacitor lower electrode LE. The second passivation layer PSV2 may be an inorganic insulating film formed of an inorganic material. As the inorganic material, polysiloxane, silicon nitride, silicon oxide, silicon oxynitride, and the like may be used. A third passivation layer PSV3 is provided on the second passivation layer PSV2. The third passivation layer PSV3 may be an inorganic insulating film formed of an inorganic material. As the inorganic material, polysiloxane, silicon nitride, silicon oxide, silicon oxynitride, and the like may be used. Although not shown in the drawing, a capacitor lower electrode may be provided between the first passivation layer PSV1 and the second passivation layer PSV2, and a capacitor upper electrode may be provided between the second passivation layer PSV2 and the third passivation layer PSV.

A source electrode SE and a drain electrode DE are provided on the third passivation layer PSV3. The source electrode SE and the drain electrode DE may be in contact with the source region and the drain region of the active pattern ACT through a contact hole formed through the third passivation layer PSV3, the second passivation layer PSV2, and the first passivation layer PSV1.

The source electrode SE and the drain electrode DE may be formed of a metal. For example, the source electrode SE and the drain electrode DE may be formed of at least one metal such as gold (Au), silver (Ag), aluminum (Al), molybdenum (Mo), chromium (Cr), titanium (Ti), nickel (Ni), neodymium (Nd), and copper (Cu), or an alloy of metals. In addition, the source electrode SE and the drain electrode DE may be formed as a single layer, but is not limited thereto, and may also be formed as a multilayer in which two or more materials selected from metals or alloys are stacked. Although not shown in the drawing, data lines or first power lines may be provided on the same layer as that of the source electrode SE and the drain electrode DE using the same material. In this regard, the data lines or the first power lines may be directly or indirectly connected to a part of the transistor in each pixel unit PXL, e.g., the source electrode SE and/or the drain electrode DE.

A fourth passivation layer PSV4 may be provided on the source electrode SE and the drain electrode DE. The fourth passivation layer PSV4 may be an inorganic insulating film formed of an inorganic material. As the inorganic material, polysiloxane, silicon nitride, silicon oxide, silicon oxynitride, and the like may be used. The fourth passivation layer PSV4 may be omitted according to an embodiment.

A first insulating layer INS1 may be provided on the fourth passivation layer PSV4. When the fourth passivation layer PSV4 is omitted, the first insulating layer INS1 may be provided on the third passivation layer PSV3.

In an embodiment of the present invention, at least one pixel unit PXL is provided on the substrate SUB. Each pixel may include a first electrode EL1 provided between the first insulating layer INS1 and a second insulating layer INS2 and a second electrode EL2 provided on the second insulating layer INS2. At least one of the first electrode EL1 and the second electrode EL2 may be a metal layer. The first electrode EL1 and the second electrode EL2 may be an anode and a cathode, respectively.

The first electrode EL1 may be a metal film formed of Ag, Mg, Al, Pt, Pd, Au, Ni, Nd, Ir, Cr, or an alloy thereof and/or may be formed of indium tin oxide (ITO), indium zinc oxide (IZO), zinc oxide (ZnO), indium tin zinc oxide (ITZO), or the like.

In an embodiment of the present invention, the first electrode EL1 may be formed of one type of metal, but is not limited thereto, and may be formed of two or more types of metals, e.g., an alloy of Ag and Mg.

In the case where an image is provided in a downward direction of the substrate SUB, the first electrode EL1 may be formed as a transparent conductive film. In the case where an image is provided in an upward direction of the substrate SUB, the first electrode EL1 may be formed as a metal reflective film and/or a transparent conductive film.

The second insulating layer INS2 that partitions regions of the pixel unit PXL to correspond to each pixel unit PXL is formed on the substrate SUB provided with the first electrode EL1 and the like. The second insulating layer INS2 may be an organic insulating film formed of an organic material. As the organic material, an organic insulating material such as a polyacrylic compound, a polyimide-based compound, a fluorine-based carbon compound such as Teflon, and a benzocyclobutene compound may be used. The second insulating layer INS2 exposes the upper surface of the first electrode EL1 and protrudes from the substrate SUB along a perimeter of the pixel unit PXL.

An organic light-emitting layer OL may be provided on the region of the pixel unit PXL region surrounded by the second insulating layer INS2.

The organic light-emitting layer OL may include a low- or high-molecular-weight (polymer) material. Examples of the low-molecular-weight material may include copper phthalocyanine (CuPc), N,N'-Di(naphthalene-1-yl)-N,N'-diphenyl-benzidine (NPB), tris-8-hydroxyquinoline aluminum (Alq3), and the like. These materials may be applied by vacuum deposition, or the like. Example of the polymer material may include PEDOT, a poly-phenylenevinylene (PPV)-based material, and a polyfluorene-based material.

The organic light-emitting layer OL may be provided as a single layer but may also be provided as a multilayer including various functional layers. When provided as a multilayer, the organic light-emitting layer OL may have a single or complex structure in which a hole injection layer, a hole transport layer, an emission layer, an electron transport layer, and an electron injection layer are stacked. The organic light-emitting layer OL may be formed by evaporation, screen printing, inkjet printing, laser induced thermal imaging (LITI), or the like.

However, the organic light-emitting layer OL is not necessarily limited thereto and may have various structures. In addition, at least a part of the organic light-emitting layer OL may be integrally formed over the plurality of first electrodes EL1 or the organic light-emitting layer OL may be provided individually to correspond to each of the plurality of first electrodes EL1.

The second electrode EL2 is provided on the organic light-emitting layer OL. The second electrode EL2 may be provided for each pixel unit PXL but may also be provided to cover most of the display area DA and may be shared by the plurality of pixel units PXL.

The second electrode EL2 may be used as either an anode or a cathode according to an embodiment. When the first electrode EL1 is an anode, the second electrode EL2 may be used as a cathode. When the first electrode EL1 is a cathode, the second electrode EL2 may be used as an anode.

The second electrode EL2 may be a metal film formed of Ag, Mg, Al, Pt, Pd, Au, Ni, Nd, Ir, or Cr and/or a transparent conductive film formed of indium tin oxide (ITO), indium zinc oxide (IZO), zinc oxide (ZnO), or indium tin zinc oxide (ITZO). In an embodiment of the present invention, the second electrode EL2 may be a multilayer including two or more layers including a metal thin-film, for example, an ITO/Ag/ITO triple layer.

In the case where an image is provided in a downward direction of the substrate SUB, the second electrode EL2 may be formed as a metal reflective film and/or a transparent conductive film. In the case where an image is provided in an upward direction of the substrate SUB, the second electrode EL2 may be formed as a transparent conductive film.

A sealing layer SL is provided on the second electrode EL2.

The sealing layer SL is provided to cover the upper surface and side surfaces of the pixel unit PXL as well as the second electrode EL2 and may be provided as a single layer. By providing the sealing layer SL, infiltration of external moisture into the pixel unit PXL may be prevented.

The sealing layer SL includes a first polymer including a polar functional group in chains thereof and an inorganic compound penetrating into the first polymer in a thickness direction to obtain the above-described moisture infiltration prevention function. A region of the sealing layer SL including the first polymer penetrated by the inorganic compound may be referred to as a penetrated layer of the sealing layer SL_D, and the penetrated layer of the sealing layer SL_D may be formed into at least one portion from the surface of the sealing layer SL in a thickness direction of the sealing layer SL. A thickness of the penetrated layer of the sealing layer SL_D may be equal to or less than a thickness of the sealing layer SL.

The sealing layer SL may include the first polymer. The first polymer refers to a polymer including a polar functional group on chains thereof. In this regard, the polar functional group may include at least one selected from the group consisting of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), and —C(O)NH—C(O)— (imide). In addition, in a molecule of the first polymer, an amount of a —C—C—, —C=C—, or —CF$_2$—CF$_2$— functional group may be less than that of the above-described polar functional group. The above-described first polymer may include, for example, at least one selected from the group consisting of polyethylene terephthalate (PET), polyimide (PI), and Nylon 6.

The sealing layer SL may have a film structure. Since the sealing layer SL is optically transparent, infiltration of moisture into the pixel unit PXL may be prevented without reflecting or distorting light emitted from the pixel unit PXL.

The sealing layer SL may be provided as a single layer, unlike thin film encapsulation (TFE) of the related art including a plurality of layers. In the related art, the TFE provided to prevent infiltration of moisture into the pixel unit PXL has a multilayer structure in which an organic layer and an inorganic layer are alternately stacked. However, such a multilayered TFE has a disadvantage of relatively low flexibility. Thus, when the multilayered TFE is applied to a flexible display device, there is a risk of damage to TFE due to a stress generated by repeated bending and folding. Moisture may infiltrate into the damaged TFE.

In contrast, since the sealing layer SL is provided as a single layer, excellent flexibility may be obtained and there is no risk of damage caused by repeated bending, folding, and stretching. In addition, the sealing layer SL provided as a single layer may transmit light emitted from the pixel unit PXL without loss or distortion of the light compared to a sealing layer or TFE provided as a multilayer.

As confirmed in the drawings, the sealing layer SL may be provided in a form surrounding the side surfaces and the upper surface of the pixel unit PXL. Accordingly, infiltration of moisture or oxygen into the pixel unit PXL may be completely prevented by the sealing layer SL together with the penetrated layer of the substrate SUB_D. In addition, similarly to the penetrated layer of the substrate SUB_D, the sealing layer SL has a structure including the first polymer and the inorganic compound penetrating into the first polymer. Due to the structure described above, water tightness and airtightness of the sealing layer SL may be maintained even when the sealing layer SL is bent or stretched.

The sealing layer SL may be selectively provided on the substrate SUB to cover the pixel unit PXL. Specifically, when a plurality of pixel units PXL are provided on the substrate SUB, the sealing layer SL may be selectively provided to correspond to regions provided with the pixel units PXL and the sealing layer SL may not be provided on regions where the pixel units PXL are not provided. As described above, by providing the sealing layer SL only on some portions of the substrate SUB, stretching-contracting of the substrate SUB by external stress may be suppressed in the regions provided with the pixel units PXL. Accordingly, damage to the pixel unit PXL or the sealing layer SL caused by the external stress may be prevented. This will be described below in more detail.

Bank units BNK are provided on side surfaces of the sealing layer SL to be in contact with the sealing layer SL.

The bank units BNK are provided on the side surfaces of the sealing layer SL on the non-pixel area SUB_NP of the substrate SUB. The bank unit BNK has flexibility by including a polymer, specifically, the bank unit BNK may include a second polymer. In the second polymer, an amount of a —C—C—, —C=C—, —CF$_2$—CF$_2$—, or —SiO— functional group may be more than that of a polar functional group. In this regard, the polar functional group may include at least one selected from the group consisting of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), and —C(O)NH—C(O)— (imide) as described above.

The second polymer included in the bank unit BNK may include, for example, at least one selected from the group consisting of polyethylene, polypropylene, polyacetylene, poly(p-phenylene), poly(p-phenylene vinylene), polystyrene, polytetrafluoroethylene (PTFE), poly(vinyl fluoride), poly(perfluoroalkoxy alkane) (PFA), and polydimethylsiloxane. When an inorganic compound is attempted to penetrate into these polymer compounds, the inorganic compound does not penetrate into the second polymer but may be deposited on the surface of the bank unit BNK including the second polymer.

Since the inorganic compound cannot penetrate into the bank unit BNK, the bank unit BNK may serve as a mask to form the penetrated layer of the substrate SUB_D selectively on the pixel area SUB_P of the substrate SUB.

The display device including the penetrated layer of the substrate SUB_D and the penetrated layer of the sealing layer SL_D is described above. As described above, the penetrated layer of the substrate SUB_D and the penetrated layer of the sealing layer SL_D have similar structures in that both include the first polymer and the inorganic compound penetrating into the first polymer. Hereinafter, this structure will be described in more detain using the penetrated layer of the substrate SUB_D.

Figure 4:
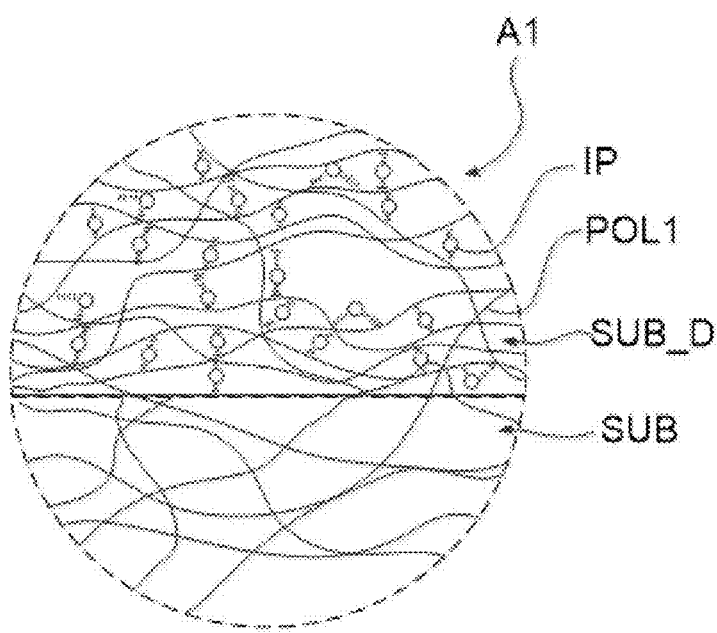
FIG. 4 is an enlarged sectional view of Region A1 of FIG. 3.

FIG. 4 is an enlarged sectional view of Region A1 of FIG. 3.

Although Region A1 of the substrate SUB will be described hereinafter, technical conception of the substrate SUB may also be applied to the sealing layer SL in the same manner. However, in providing the substrate SUB and the sealing layer SL, those skilled in the art may adjust a specific form, a chemical composition, or the like within the scope of the invention.

The substrate SUB includes a polymer layer formed of the first polymer POL1. The polymer layer of the substrate SUB may be a layer in which a plurality of chains of the first polymer POL1 are entangled or polymerized. The first polymer POL1 includes a polar functional group on chains thereof. The polar functional group may include at least one selected from the group consisting of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), and —C(O)NH—C(O)— (imide).

The polar functional group of the first polymer POL1 may include a C═O bond in a molecule thereof. The C═O bond reacts with the inorganic compound IP penetrating into the substrate SUB to allow the inorganic compound to be diffused into the substrate SUB more rapidly and widely and then react. For example, the inorganic compound IP may be rapidly diffused by penetrating into the substrate SUB in the form of trimethylaluminum and then reacting with the C═O bond. In addition, the provided trimethylaluminum may react with additionally introduced moisture, ozone, or the like. Therefore, sequential injection of moisture/ozone may be repeated to form the penetrated layer of the substrate SUB_D in the substrate SUB. The inorganic compound IP may be fixed in the polymer layer in the form of aluminum oxide. As the inorganic compound IP is fixed to the first polymer POL1 in the substrate SUB as described above, the penetrated layer of the substrate SUB_D including the inorganic compound IP may be formed.

The polar functional group of the first polymer POL1 may include at least one functional group selected from the group consisting of a hydroxy (—OH) functional group, an amine (—NH$_2$) functional group, and a thiol (—SH) functional group. The polar functional group may react with an inorganic compound precursor, and the inorganic compound precursor serving as a Lewis acid may donate electrons to the functional group and then be oxidized. Accordingly, strong electrostatic attraction acts between the inorganic compound precursor and the hydroxy (—OH) functional group, the amine (—NH$_2$) functional group, or the thiol (—SH) functional group, and thus the inorganic compound precursor may be diffused into the substrate SUB more rapidly and widely.

In the case where the substrate SUB is formed of another polymer, e.g., a second polymer, different from the first polymer POL1, the penetrated layer of the substrate SUB_D, which is formed by the inorganic compound IP penetrating into the substrate SUB as described above, may not be formed. In this case, the inorganic compound IP may be deposited on the surface of the substrate SUB, and the inorganic compound IP layer formed on the surface of the substrate SUB may be peeled off due to repeatedly applied mechanical stress.

Looking at the penetrated layer of the substrate SUB_D more closely, the penetrated layer of the substrate SUB_D may have a structure in which the inorganic compound IP is fixed in the first polymer POL1. In this regard, the inorganic compound IP provided in the first polymer POL1 is fixed by the polar functional group of the first polymer POL1. Specifically, a binding force due to a covalent bond, a hydrogen bond, a dipole bond, or the like may be provided between the polar functional group on the chains of the first polymer POL1 and the inorganic compound IP. As the polar functional group binds to the inorganic compound IP in the penetrated layer of the substrate SUB_D, the penetrated layer of the substrate SUB_D may be provided integrally with the substrate SUB.

Because the inorganic compound IP is provided in the first polymer POL1 in the penetrated layer of the substrate SUB_D, infiltration of moisture may be prevented. Specifically, the inorganic compound IP in the first polymer POL1 eliminates empty space between molecules of the first polymer POL to prevent water molecules from passing through the first polymer POL1 and infiltrating into the pixel unit. The penetrated layer of the substrate SUB_D may have a water vapor transmission rate (WVTR) of $10^{-6}$ g·m$^{-2}$ day$^{-1}$ or less. Since the penetrated layer of the substrate SUB_D has a low WVTR as described above, a lifespan of the display device may be significantly increased, so that the display device may be stably driven over 10,000 hours even in a highly humid environment.

A thickness of the penetrated layer of the substrate SUB_D may be from about 10 nm to about 500 nm. A thickness of the penetrated layer of the substrate SUB_D may be determined in consideration of the thickness of the substrate SUB. The thickness of the penetrated layer of the substrate SUB_D may also vary in accordance with the composition of the polymer layer. For example, the first polymer POL may include at least one selected from the group consisting of polyethylene terephthalate (PET), polyimide (PI), and Nylon 6, and a penetration depth of the inorganic compound IP into the substrate SUB may vary in accordance with the type of the first polymer POL1. This is because a chemical interaction pattern with the inorganic compound IP may vary according to the type of the first polymer POL1. In addition, since performance of the penetrated layer of the substrate SUB_D in preventing moisture infiltration varies according to the type of the first polymer POL1, a required thickness of the penetrated layer of the substrate SUB_D may vary according to the type of the first polymer POL1. Therefore, there is a need for an elaborate design for a process of forming the penetrated layer of the substrate SUB_D in consideration of the type of the first polymer POL1.

Figure 5:
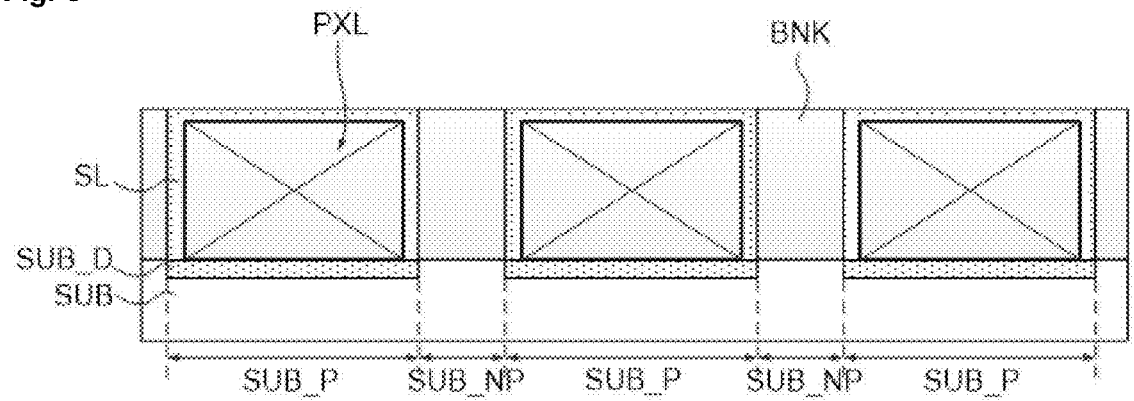
FIG. 5 is a cross-sectional view of a display device according to an embodiment of the present invention.

FIG. 5 is a cross-sectional view of a display device according to an embodiment of the present invention.

Referring to FIG. 5, a plurality of pixel units PXL are provided on the substrate SUB, and each pixel unit PXL is covered by the sealing layer SL. The sealing layer SL individually covers each pixel unit PXL, and the bank unit BNK is provided between two adjacent pixel units PXL. In addition, the penetrated layer of the substrate SUB_D is provided on a region provided with the pixel unit PXL. The penetrated layer of the substrate SUB_D is not provided on the region provided with the bank unit BNK.

An elasticity of the pixel area SUB_P provided with the penetrated layer of the substrate SUB_D and the sealing layer SL is different from that of the non-pixel area SUB_NP not provided with the same. Specifically, the elasticity of the substrate SUB in the pixel area SUB_P may be lower than that in the non-pixel area SUB_NP. This may be caused by relatively rigid properties of the penetrated layer of the substrate SUB_D and the sealing layer SL provided in the pixel area SUB_P. In the penetrated layer of the substrate SUB_D and the sealing layer SL, the inorganic compound IP is fixed in the first polymer POL1, thereby inhibiting elongation of the first polymer POL1.

Therefore, when an external force is applied to the display device, the pixel area SUB_P of the substrate SUB is less deformed, and the non-pixel area SUB_NP may be deformed relatively more. Because only the flexible substrate SUB and the flexible bank unit BNK including the second polymer are provided in the non-pixel area SUB_NP, there is no risk of deformation. In addition, because deformation of the substrate SUB is inhibited relatively more in the pixel area SUB_P, there is no risk of damage caused by stretching or contracting in the pixel units PXL stacked on the substrate SUB.

In the drawing, the pixel unit PXL does not necessarily indicate one pixel unit. For example, the pixel unit PXL may refer to a pixel unit assembly including a red pixel unit emitting red light, a blue pixel unit emitting blue light, and a green pixel unit emitting green light. Alternatively, in another embodiment, the pixel unit PXL may refer to one of a red pixel unit emitting red light, a blue pixel unit emitting blue light, and a green pixel unit emitting green light. The form of the pixel unit PXL may be determined in consideration of size, resolution, intended use, and the like of the display device.

The structure of the display device according to an embodiment of the present invention is described above. Hereinafter, a method of manufacturing a display device will be described in more detail.

Figure 6:
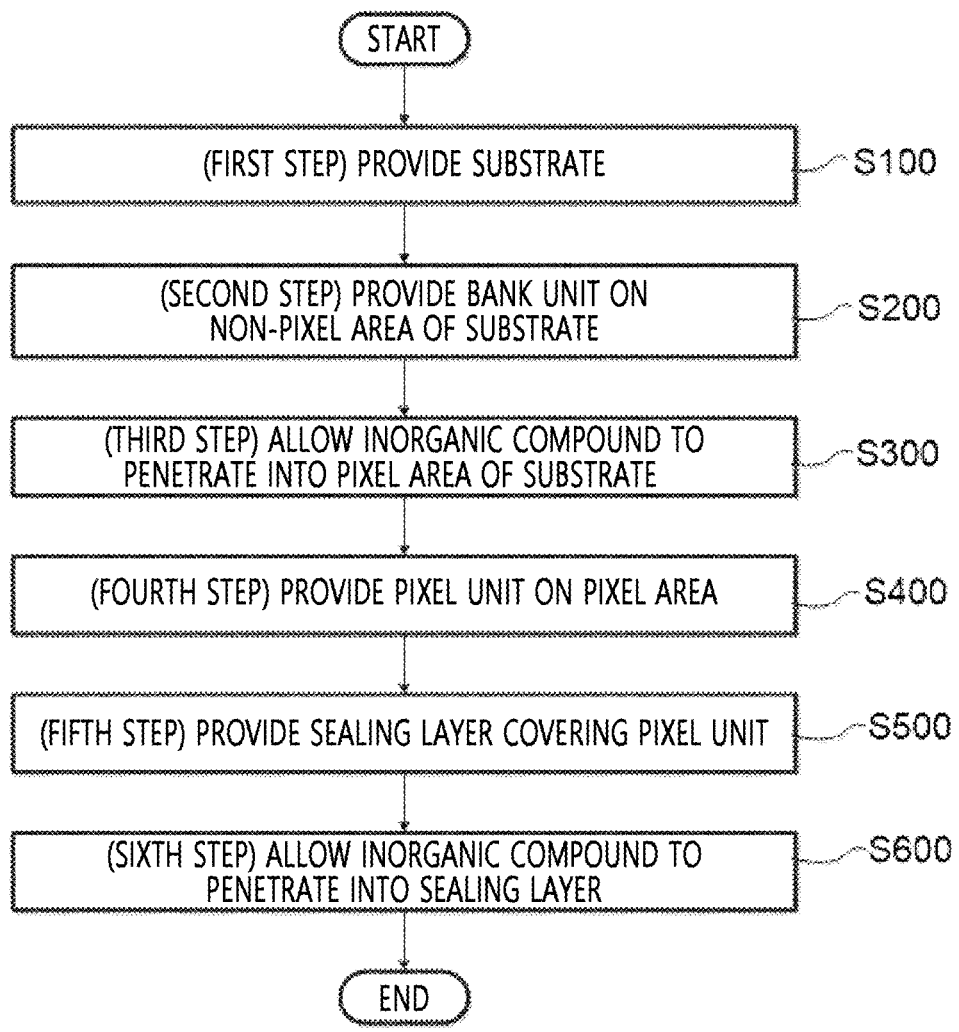
FIG. 6 is a flowchart illustrating a method of manufacturing a display device according to an embodiment of the present invention.
Figure 7:
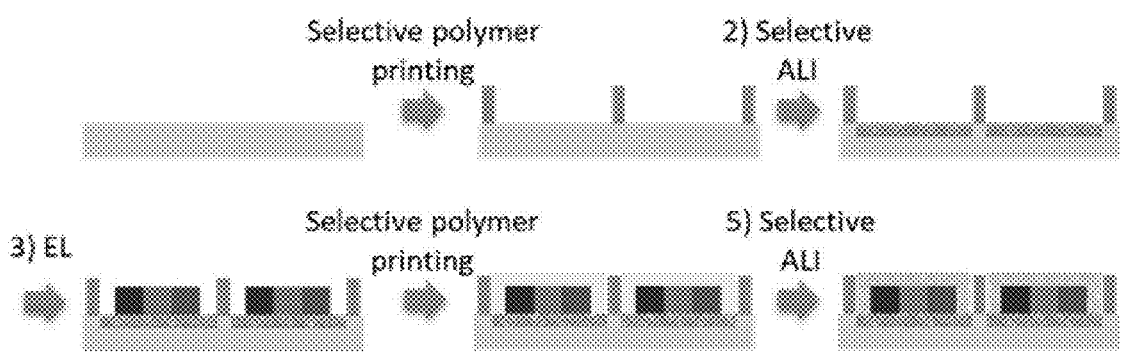
FIG. 7 is a cross-sectional view illustrating each step of a method of manufacturing a display device.

FIG. 6 is a flowchart illustrating a method of manufacturing a display device according to an embodiment of the present invention. FIG. 7 is a cross-sectional view illustrating each step of a method of manufacturing a display device.

Referring to FIGS. 6 and 7, provided is a method of manufacturing a stretchable display device including: a first step of providing a stretchable substrate including a pixel area and a non-pixel area (S100); a second step of providing a bank unit in at least one portion of the non-pixel area of the substrate (S200); a third step of allowing an inorganic compound to selectively penetrate into the pixel area of the substrate (S300); a fourth step of providing a pixel unit in the pixel area of the substrate (S400); a fifth step of providing a sealing layer covering the pixel unit (S500); and a sixth step of allowing an inorganic compound to penetrate into the sealing layer (S600). In this regard, the substrate includes a first polymer in which a polar functional group is provided on chains thereof. As the inorganic compound selectively penetrates into the pixel area between the non-pixel area and the pixel area of the substrate and binds to the polar functional group on the chains of the first polymer, a composite of the inorganic compound and the first polymer may be provided in the pixel area of the substrate.

First, in the first step (S100), the substrate is provided. The substrate may refer to a substrate of the display device including an additional component provided to the substrate to perform a process. In the first step (S100), the substrate may be provided in a chamber where a reaction process is performed. A method of providing the substrate may vary according to size of the substrate. For example, the substrate may be provided in the chamber using various methods such as adsorption and a conveyer method.

Subsequently, according to the second step (S200), the bank is provided on the non-pixel area of the substrate. The bank unit may include a second polymer and may be provided by inkjet printing, plasma polymerization, initiated chemical vapor deposition (iCVD), or the like. The inkjet printing is advantageous in that a process may be performed at ambient pressure, does not require a mask, and has a low manufacturing cost. The plasma polymerization and iCVD are vapor deposition methods and deposition may be performed on a selected area using a mask. However, any other method of providing the bank unit may be used in addition to the above-described methods.

After the second step (S200) is performed, the non-pixel area of the substrate may be covered by the bank unit and the pixel area may be exposed.

Subsequently, the third step (S300) of allowing the inorganic compound to selectively penetrate into the pixel area of the substrate is performed.

In the third step (S300), the penetrated layer of the substrate is prepared by allowing the inorganic compound to penetrate into the pixel area of the substrate. Penetration of the inorganic compound may be performed by supplying an inorganic compound precursor gas into the chamber in which the substrate is provided. In this case, an inorganic compound penetration process may be performed at a temperature of about 50° C. to about 120° C. However, the temperature at which the process is performed may be determined differently in accordance with the type of the first polymer. For example, in the case where the first polymer is polyethylene terephthalate (PET), diffusion of the inorganic compound is relatively easy, so that the process of forming the penetrated layer of the substrate may be performed at a relatively low temperature of 50° C. to 100° C.

In the third step (S300), as the inorganic compound is supplied into the substrate in the form of an inorganic compound precursor and the inorganic compound binds to the C=O bond of the first polymer in the substrate, the binding strength between the inorganic compound and the first polymer may be improved. Specifically, the inorganic compound in an oxide form may strongly bind to the polar functional group of the first polymer and cannot pass through the chains of the polymer after being converted from the inorganic compound precursor in a gaseous phase into an oxide in a solid phase, so that the substrate including the first polymer and the inorganic compound may be provided integrally.

The inorganic compound penetrating in the third step (S300) may be an oxide, nitride, oxynitride of any metal generally formed by atomic layer deposition, such as $Al_2O_3$, $TiO_2$, HfO, $SiO_2$, and SiN. However, the inorganic compound penetrating in the third step (S300) may be a material that may be deposited at a temperature lower than a glass transition temperature of the first polymer and the second polymer. When the deposition temperature of the inorganic compound is higher than glass transition temperatures of the first polymer and the second polymer, the polymers may be deformed during the inorganic compound penetration process. In this case, the substrate and the bank unit formed of the polymers may be deformed, thereby deteriorating overall structural stability of the display device.

In the third step (S300), the inorganic compound does not penetrate into the bank unit. This is because the bank unit is formed of the second polymer, and the second polymer has a larger amount of the —C—C—, —C=C—, —$CF_2$—$CF_2$—, or —SiO— functional group than that of the polar functional group as described above. The —C—C—, —C=C—, —$CF_2$—$CF_2$—, or —SiO— functional group is difficult to react with the inorganic compound precursor.

Therefore, the inorganic compound does not penetrate into the non-pixel area of the substrate provided with the bank unit. Accordingly, after performing the third step (S300), the inorganic compound may selectively penetrate into the pixel area of the substrate.

Subsequently, according to the fourth step (S400), the pixel unit is provided on the substrate. The pixel unit is provided on the pixel area of the substrate. The pixel unit may include the above-described transistor and a light-emitting member such as an OLED. They may be provided using a conventional process such as deposition and etching.

Next, according to the fifth step (S500) and the sixth step (S600), the sealing layer is provided to cover the pixel unit, and the penetrated layer of the sealing layer is formed via penetration of the inorganic compound into the sealing layer. The sealing layer may be provided using a method similar to that for the bank unit such as inkjet printing, plasma polymerization, and iCVD. The sealing layer may be provided to cover the pixel unit without being provided on the bank unit. A process of allowing the inorganic compound to penetrate into the sealing layer may be performed similarly to that for penetration of the inorganic compound into the substrate. In this regard, the inorganic compound penetration process may be performed at a relatively low temperature of 50° C. to 100° C. as described above. Therefore, even when the pixel unit includes an organic light-emitting layer, there is no risk of deterioration of the pixel unit during the manufacturing process of the sealing layer.

Figure 8:
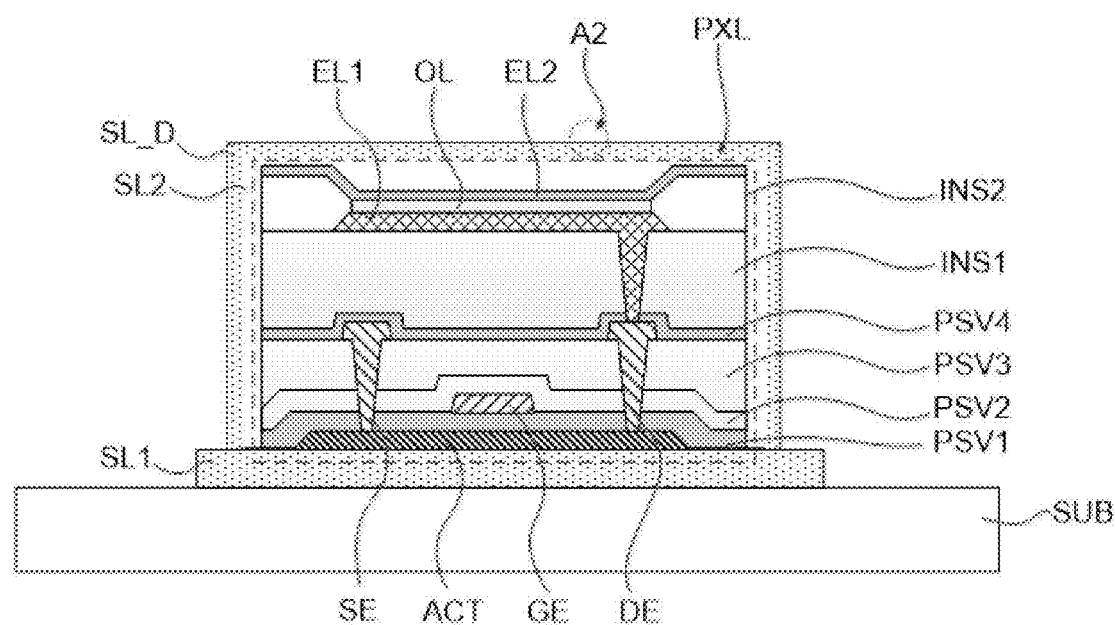
FIG. 8 is an enlarged sectional view of a display device according to an embodiment of the present invention.

FIG. 8 is an enlarged sectional view of a display device according to an embodiment of the present invention.

Referring to FIG. 8, descriptions focusing on parts different from those of the above-described display device will be given.

The substrate SUB may include a second polymer mainly including a —C—C—, —C═C—, or —CF$_2$—CF$_2$— functional group and a small amount of the polar functional group. Examples of the second polymer included in the substrate SUB may include polyethylene, polypropylene, polyacetylene, poly(p-phenylene), poly(p-phenylene vinylene), polystyrene, polytetrafluoroethylene (PTFE), poly(vinyl fluoride), poly(perfluoroalkoxy alkane) (PFA), or the like.

A first sealing layer SL1 is provided on the substrate SUB. The first sealing layer SL1 is provided between the substrate SUB and the pixel unit PXL to prevent infiltration of moisture or oxygen between the substrate SUB and the pixel unit PXL.

Unlike conventional thin film encapsulation (TFE) including a plurality of layers, the first sealing layer SL1 may be provided as a single layer. In the related art, the TFE provided to prevent moisture from infiltrating into the display portion DP has been prepared in a multilayer structure in which an organic layer and an inorganic layer are alternately stacked. However, such a multilayered TFE has a disadvantage of relatively low flexibility. Therefore, the TFE may be damaged by a stress generated by repeated bending and folding when applied to flexible display devices. Moisture may infiltrate into the damaged TFE. The above-described damage does not occur in the first sealing layer SL1 provided as a single layer.

The first sealing layer SL1 may have a structure in which the inorganic compound penetrates into a polymer layer including the first polymer. Specifically, the first sealing layer SL1 includes the polymer layer including a polar functional group on chains thereof and the inorganic compound penetrating into the polymer layer in a thickness direction thereof. In this case, the inorganic compound binds to the polar functional group on the chains of the polymer layer to be provided between the chains of the polymer layer. The structure of the first sealing layer SL1 including the polymer layer and the inorganic compound will be described in more detail below.

The pixel unit PXL is provided on the first sealing layer SL1. The pixel unit PXL may include a transistor and a light-emitting unit and emit light in accordance with a signal applied thereto.

A second sealing layer SL2 is provided on the second electrode EL2.

The second sealing layer SL2 is provided in a form covering not only the second electrode EL2 but also the upper surface and side surfaces of the pixel unit PXL, as a single layer. By providing the second sealing layer SL2, infiltration of external moisture into the pixel unit PXL may be prevented.

The second sealing layer SL2 includes a polymer layer including a first polymer having a polar functional group on chains thereof and an inorganic compound IP penetrating into the polymer layer in a thickness direction to obtain the above-described function in preventing infiltration of external moisture. A region of the polymer layer into which the inorganic compound IP penetrates may be referred to as a penetrated layer SL_D, and the penetrated layer SL_D may be provided into at least one portion from the surface of the second sealing layer SL2 in a thickness direction of the second sealing layer SL2. A thickness of the penetrated layer SL_D may be equal to or less than a thickness of the second sealing layer SL2.

The second sealing layer SL2 may have a film structure. Since the second sealing layer SL2 is optically transparent, infiltration of moisture into the pixel unit PXL may be prevented without reflecting or distorting light emitted from the pixel unit PXL.

The second sealing layer SL2 may be provided as a single layer, unlike thin film encapsulation (TFE) of the related art including a plurality of layers. In the related art, the TFE provided to prevent infiltration of moisture into the pixel unit PXL has a multilayer structure in which an organic layer and an inorganic layer are alternately stacked. However, such a multilayered TFE has a disadvantage of relatively low flexibility. Thus, when the multilayered TFE is applied to flexible display devices, there is a risk that the TFE is damaged by a stress generated by repeated bending and folding. Moisture may infiltrate into the damaged TFE.

However, since the second sealing layer SL2 is provided as a single layer, excellent flexibility may be obtained and there is no risk of damage caused by repeated bending, folding, and stretching. In addition, the second sealing layer SL2 provided as a single layer may transmit light emitted from the pixel unit PXL without loss or distortion of the light compared to a sealing layer or TFE provided as a multilayer.

As confirmed in the drawing, the first sealing layer SL1 and the second sealing layer SL2 may be provided in a form surrounding the side surfaces and the upper surface of the pixel unit PXL. Accordingly, infiltration of moisture or oxygen into the pixel unit PXL may be completely prevented. Also, the first sealing layer SL1 and the second sealing layer SL2 have a structure including the polymer layer and the inorganic compound penetrating into the polymer layer. The first sealing layer SL1 and the second sealing layer SL2 having such a structure may have elasticity and watertightness and airtightness thereof may be maintained without causing damages even when they are bent or stretched.

The first sealing layer SL1 and the second sealing layer SL2 may be selectively provided on the substrate SUB to cover the pixel unit PXL. Specifically, when a plurality of pixel units PXL are provided on the substrate SUB, the first sealing layer SL1 and the second sealing layer SL2 may be selectively provided on regions provided with the pixel units PXL and the first sealing layer SL1 and the second sealing layer SL2 may not be provided on regions where the pixel unit PXL is not provided. As described above, by providing the first sealing layer SL1 and the second sealing layer SL2 only on some portions of the substrate SUB, stretching-contracting of the substrate SUB by an external stress may be suppressed in the regions of the substrate SUB provided with the pixel units PXL. Accordingly, damage to the pixel unit PXL, the first sealing layer SL1, or the second sealing layer SL2 may be prevented. This will be described below in more detail.

The structure of the display device including the first sealing layer SL1 and the second sealing layer SL2 is described above. Hereinafter, chemical structures of the first sealing layer SL1 and the second sealing layer SL2 will be described in more detail.

Figure 9:
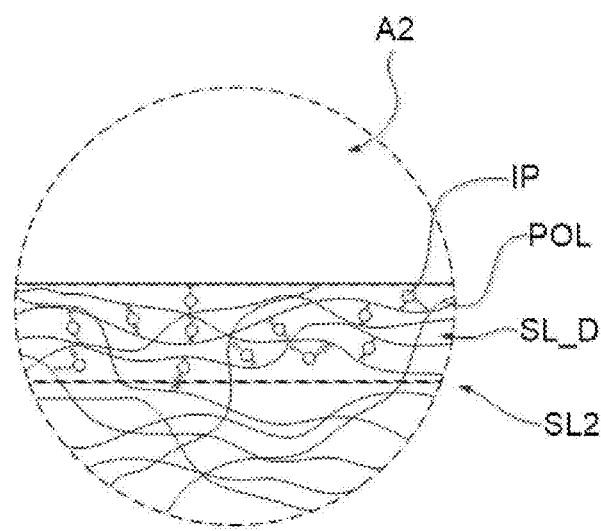
FIG. 9 is an enlarged sectional view of Region A2 of FIG. 8.

FIG. 9 is an enlarged sectional view of Region A2 of FIG. 8.

Although Region A2 of the second sealing layer SL2 will be described hereinafter, technical conception of the second sealing layer SL2 may also be applied to the first sealing layer SL1 in the same manner. However, in providing the first sealing layer SL1 and the second sealing layer SL2, those skilled in the art may adjust a specific form, a chemical composition, or the like within the scope of the invention.

The polymer layer included in the second sealing layer SL2 may be a layer formed of a plurality of chains of the first polymer POL. The chains of the first polymer POL include a polar functional group. The polar functional group may include at least one selected from the group consisting of —O— (ether), —C(O)O— (ester), —C(O)NH— (amide), —OC(O)O— (carbonate), —OH (alcohol), —SH (thiol), —$NH_2$ (amine), —NHC(O)NH— (urea), —OC(O)NH— (urethane), and —C(O)NH—C(O)— (imide).

The polar functional group of the first polymer included in the second sealing layer SL2 may include a C=O bond. The C=O bond reacts with the inorganic compound penetrating between the chains of the first polymer POL to allow the inorganic compound to be diffused into the polymer layer more rapidly and widely and then react. For example, the inorganic compound IP may be rapidly diffused by penetrating into the polymer layer in the form of trimethylaluminum and then reacting with the C=O bond. In addition, the provided trimethylaluminum may react with additionally introduced moisture, ozone, or the like. Therefore, sequential injection of moisture/ozone may be repeated to form the second sealing layer SL2. The inorganic compound IP may be fixed in the polymer layer in the form of aluminum oxide. As the inorganic compound IP is fixed in the polymer layer as described above, the penetrated layer SL_D of the polymer layer including the inorganic compound IP may be formed.

The polar functional group of the first polymer included in the second sealing layer SL2 may include at least one selected from the group consisting of a hydroxy (—OH) functional group, an amine (—$NH_2$) functional group, and a thiol (—SH) functional group. The polar functional group (?) may react with an inorganic compound precursor, and the inorganic compound precursor serving as a Lewis acid may donate electrons to the functional group and then be oxidized. Accordingly, strong electrostatic attraction acts between the inorganic compound precursor and the hydroxy (—OH) functional group, the amine (—$NH_2$) functional group, or the thiol (—SH) functional group, and thus the inorganic compound precursor may be diffused into the polymer layer more rapidly and widely.

In formation of the second sealing layer SL2, the polymer used to form the second sealing layer SL2 cannot be randomly selected. Specifically, in the case where a polymer including a small amount of the polar functional group is used, it is difficult to provide the second sealing layer SL2 including the penetrated layer SL_D formed by penetration of the inorganic compound. For example, in the case of using a polymer mainly including a —C—C—, —C=C—, —$CF_2$—$CF_2$—, or —SiO— functional group, which is hard to react with the inorganic compound precursor, it is difficult to form the second sealing layer SL2. Examples of the polymer compound may include at least one selected from the group consisting of polyethylene, polypropylene, polyacetylene, poly(p-phenylene), poly(p-phenylene vinylene), polystyrene, polytetrafluoroethylene (PTFE), poly(vinyl fluoride), and poly(perfluoroalkoxy alkane) (PFA). When an inorganic compound IP is attempted to penetrate into these polymer compounds, the inorganic compound IP does not penetrate into the polymer layer to form a penetrated layer SL_D, but may be deposited on the surface of the polymer layer. In this case, since the polymer layer is not provided integrally with an inorganic compound layer, the two layers may be detached from each other by repeated mechanical stress.

Looking at the penetrated layer SL_D, the penetrated layer SL_D may have a structure in which the inorganic compound IP is fixed between chains of the first polymer POL. In this regard, the inorganic compound IP provided between the chains of the first polymer POL is fixed by the polar functional group on the chains of the first polymer POL. Specifically, a binding force due to a covalent bond, a hydrogen bond, a dipole bond, or the like may be provided between the polar functional group on the chains of the first polymer POL and the inorganic compound IP. As the polar functional group binds to the inorganic compound IP in the penetrated layer SL_D, the penetrated layer SL_D may be provided integrally with the second sealing layer SL2. Specifically, while TFE has an organic layer/inorganic layer/organic layer stack structure according to the related art, the penetrated layer SL_D and the second sealing layer SL2 may be integrally provided according to the present invention. Accordingly, although mechanical stress caused by bending is repeatedly applied to the second sealing layer SL2, there is no risk of damage to the second sealing layer SL2. In addition, since the second sealing layer SL2 is provided as a single layer, optical transparency may be enhanced.

Because the inorganic compound IP is provided between the chains of the first polymer POL in the penetrated layer SL_D, infiltration of moisture may be prevented. Specifically, the inorganic compound IP provided between the chains of the first polymer POL eliminates empty space in the polymer layer to prevent water molecules from passing through the chains of the first polymer POL and infiltrating into second sealing layer SL2. The second sealing layer SL2 may have a water vapor transmission rate (WVTR) of $10^{-6}$ $g \cdot m^{-2}$ $day^{-1}$ or less. Since the second sealing layer SL2 has a low WVTR as described above, a lifespan of the display device including the second sealing layer SL2 may be significantly increased, so that the display device may be stably driven over 10,000 hours even in a highly humid environment.

A thickness of the penetrated layer SL_D may be from about 10 nm to about 500 nm. The thickness of the penetrated layer SL_D may be determined in consideration of the thickness of the second sealing layer SL2. The thickness of the penetrated layer SL_D may also vary in accordance with the composition of the polymer layer. For example, the polymer layer may include at least one selected from the group consisting of polyethylene terephthalate (PET), polyimide (PI), and Nylon 6, and a penetration depth of the inorganic compound IP into the polymer layer may vary in accordance with the type of the first polymer included in the polymer layer. This is because a chemical interaction pattern with the inorganic compound IP may vary according to the type of the polymer compound constituting the polymer layer. In addition, since performance of the penetrated layer of the polymer layer in preventing moisture infiltration varies according to the type of the polymer compound, a required thickness of the penetrated layer SL_D may vary according to the type of the polymer compound. Therefore, since the penetration easiness (penetration depth) of the inorganic compound IP varies according to the type of the polymer compound and the required thickness of the penetrated layer SL_D varies thereby, there is a need for an elaborate design for a process of forming the second sealing layer SL2 in consideration of the type of the polymer compound.

Figure 10:
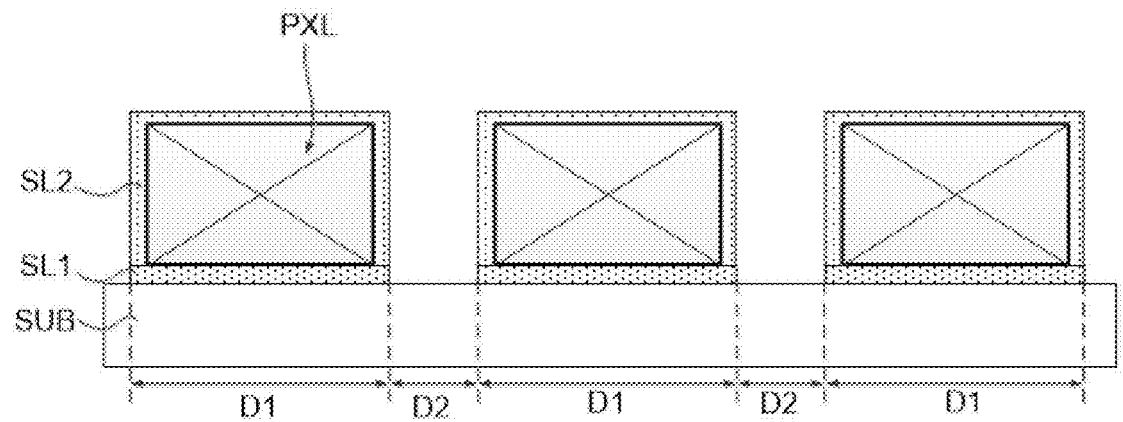
FIG. 10 is a cross-sectional view of a display device according to an embodiment of the present invention.

FIG. 10 is a cross-sectional view of a display device according to an embodiment of the present invention.

Referring to FIG. 10, a plurality of pixel units PXL are provided on the substrate SUB, and each pixel unit PXL is covered by the first sealing layer SL1 and the second sealing layer SL2. The first sealing layer SL1 and the second sealing layer SL2 covers each pixel unit PXL, and a region not provided with the first sealing layer SL1 and the second sealing layer SL2 may be provided between two adjacent pixel units PXL. Therefore, a region, specifically a region of the substrate SUB between two adjacent pixel units PXL, may be exposed without being covered with the first sealing layer SL1 and/or the second sealing layer SL2.

Because the first sealing layer SL1 and the second sealing layer SL2 are provided on some regions of the substrate SUB, the display device including the substrate SUB, the first sealing layer SL1, and the second sealing layer SL2 may have different elasticity by region. Specifically, one region D1 covered by the first sealing layer SL1 and the second sealing layer SL2 may have an elasticity different from that of another region D2 not provided with the first sealing layer SL1 and the second sealing layer SL2.

In the case of the region D1 covered by the first sealing layer SL1 and the second sealing layer SL2, the polymer layer and/or the inorganic compound are densely provided on the substrate SUB, and stretching or contracting of the substrate SUB may be inhibited by attraction with the substrate SUB. In contrast, in the case of the region D2 not provided with the first sealing layer SL1 and the second sealing layer SL2, flexible properties of the substrate are not inhibited, and thus the region D2 may be relatively more stretched or contracted.

Therefore, when an external force is applied to the display device, the region D1 covered by the first sealing layer SL1 and the second sealing layer SL2 is less deformed, and the region D2 not provided with the first sealing layer SL1 and the second sealing layer SL2 may be deformed relatively more. Because only the flexible substrate SUB is provided in the region D2 not provided with the first sealing layer SL1 and the second sealing layer SL2, there is no risk of deformation. In addition, because deformation of the substrate SUB is inhibited relatively more in the region D1 covered with the first sealing layer SL1 and the second sealing layer SL2, there is no risk of damage caused by stretching or contracting in the pixel units PXL stacked on the substrate SUB.

The structure of the display device according to an embodiment of the present invention is described above. Hereinafter, a method of manufacturing the display device will be described in more detail.

Figure 11:
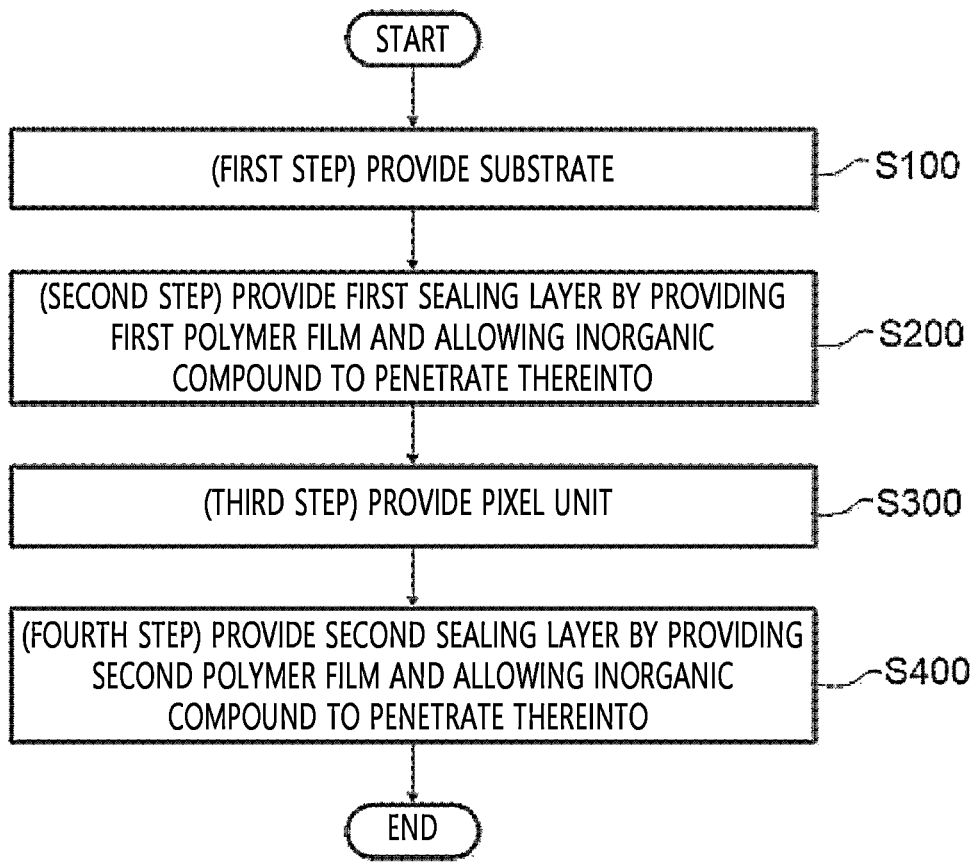
FIG. 11 is a flowchart illustrating a method of manufacturing a display device according to an embodiment of the present invention.

FIG. 11 is a flowchart illustrating a method of manufacturing a display device according to an embodiment of the present invention.

Referring to FIG. 11, provided is a method of manufacturing a display device including: a first step of providing a substrate (S100), a second step of forming a first sealing layer by providing a first polymer film on the substrate and allowing an inorganic compound to penetrate into the first polymer film (S200), a third step of providing a pixel unit on the first sealing layer (S300), and a fourth step of forming a second sealing layer by providing a second polymer film covering the pixel unit, and allowing an inorganic compound to penetrate into the second polymer film (S400). In this case, the first sealing layer and the second sealing layer may be provided in a form exposing at least one portion of the substrate, and each of the first sealing layer and the second sealing layer includes: a polymer layer including a polar functional group on chains thereof; and the inorganic compound penetrating into the polymer layer in a thickness direction thereof, wherein the inorganic compound binds to the polar functional group on the chains of the polymer layer to be provided between the chains of the polymer layer.

First, in the first step (S100), the substrate is provided. The substrate may refer to a substrate of the display device including an additional component provided to the substrate to perform a process. In the first step (S100), the substrate may be provided in a chamber where a reaction process is performed. A method of providing the substrate may vary according to size of the substrate. For example, the substrate may be provided in the chamber using various methods such as adsorption and a conveyer method.

Subsequently, according to the second step (S200), the first sealing layer is prepared by providing the first polymer film on the substrate and allowing the inorganic compound to penetrate into the first polymer film. The first polymer film may be provided on only a region of the substrate in consideration of regions for pixel units.

In the second step (S200), the first polymer film may be provided on the substrate using various methods such as inkjet printing, plasma polymerization, and iCVD. The inkjet printing is advantageous in that a process is performed at ambient pressure, does not require a mask, and has a low manufacturing cost. The plasma polymerization and iCVD are vapor deposition methods and deposition may be performed on a selected area using a mask. However, any other method of providing the first polymer film may be used in addition to the above-described methods.

In the second step (S200), after providing the first polymer film, the first sealing layer is prepared by penetration of the inorganic compound into the first polymer film. Penetration of the inorganic compound may be performed by supplying an inorganic compound precursor gas into the chamber in which the first polymer film is provided. In this case, an inorganic compound penetration process may be performed at a temperature of about 50° C. to about 120° C. However, the temperature at which the process is performed may be determined differently in accordance with the type of the polymer compound constituting the polymer layer. For example, in the case where the polymer compound constituting the polymer layer is polyethylene terephthalate (PET), diffusion of the inorganic compound is relatively easy, so that the process of forming the sealing layer may be performed at a relatively low temperature of 50° C. to 100° C.

In the process of forming the sealing layer, as the inorganic compound is supplied into the polymer layer in the form of an inorganic compound precursor and the inorganic compound binds to the C=O bond in the polymer layer, the binding strength between the inorganic compound and the polymer layer may be improved. Specifically, the inorganic compound in an oxide form may strongly bind to the polar functional group of the polymer layer and cannot pass through the chains of the polymer after being converted from the inorganic compound precursor in a gaseous phase into an oxide in a solid phase, so that the polymer layer and the inorganic compound may be provided integrally.

In the second step (S200), even when the penetration of the inorganic compound is performed in a chamber in which the substrate and the first polymer film are placed as described above, the inorganic compound may selectively penetrate into the first polymer film without penetrating into the substrate. Such selective penetration of the inorganic compound may be caused by a composition difference between the polymers respectively constituting the substrate and the first polymer film. Specifically, the polymer included in the substrate may include a larger amount of a —C—C—, —C=C—, —CF$_2$—CF$_2$—, or —SiO— functional group than that of the polar functional group. In contrast, the polymer layer provided in the first polymer film may include a larger amount of the polar functional group than that of the —C—C—, —C=C—, —CF$_2$—CF$_2$—, or —SiO— functional group. The —C—C—, —C=C—, —CF$_2$—CF$_2$—, or —SiO— functional group is difficult to react with the inorganic compound precursor. Thus, the first polymer film including a relatively low amount of the functional group reacts with the inorganic compound precursor to form the first sealing layer penetrated by the inorganic compound, and the substrate may remain without reacting with the inorganic compound precursor.

Subsequently, according to the third step (S300), the pixel unit is provided on the first sealing layer. The pixel unit may include the above-described transistor and light-emitting member such as an OLED. They may be provided using a conventional process such as deposition and etching. The pixel unit may be provided in a region provided with the first sealing layer as described above.

Next, according to the fourth step (S400), the second sealing layer is prepared by providing the second polymer film to cover the pixel unit and allowing the inorganic compound to penetrate into the second polymer film. The second polymer film and a process of forming the second polymer film may be similar to the first polymer film and the process of forming the first sealing layer as described above. The process of forming the second sealing layer may also be performed at a relatively low temperature of 50° C. to 120° C. According to an embodiment of the present invention, a high-temperature sputtering or deposition process is not required in the formation of the sealing layer, and thus there is no risk of deformation of the organic light-emitting layer during the process of forming the sealing layer.

The first sealing layer and the second sealing layer may be provided in a form exposing at least one portion of the substrate, and each of the first sealing layer and the second sealing layer includes: the polymer layer including the first polymer having a polar functional group on chains thereof; and the inorganic compound penetrating into the polymer layer in a thickness direction thereof, wherein the inorganic compound may bind to the polar functional group on the chains of the first polymer to be provided between the chains of the first polymer.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

Therefore, the scope of the disclosure is defined not by the detailed description, but by the claims and their equivalents, and all variations within the scope of the claims and their equivalents are to be construed as being included in the disclosure.

The invention claimed is:
1. A stretchable display device comprising:
a stretchable substrate including a pixel area and a non-pixel area;
pixel units provided on the pixel area of the substrate;
bank units provided on the non-pixel area of the substrate; and
a sealing layer covering the pixel units,
wherein the substrate comprises a substrate polymer with a polar functional group, the sealing layer comprises a sealing polymer with a polar functional group, and the bank units comprise a bank polymer;
a substrate composite of an inorganic compound and the substrate polymer is provided in the pixel area of the substrate, wherein the inorganic compound penetrates into the pixel area and binds to the polar functional group of the substrate polymer, and
a sealing composite of the inorganic compound within the sealing polymer, wherein the inorganic compound binds to the polar functional group of the sealing polymer,
wherein an amount of the inorganic compound in the bank unit is lower than an amount of the inorganic compound in the sealing layer.
2. The stretchable display device of claim 1, wherein the bank unit is provided between a plurality of the pixel units.
3. The stretchable display device of claim 1, wherein the bank unit polymer has a greater amount of a —C—C—, —C=C—, —CF$_2$—CF$_2$—, or —SiO— functional group than an amount of polar functional group.
4. The stretchable display device of claim 1, wherein the polar functional group of the substrate polymer and the sealing polymer comprises at least one of —O— (ether), —C(O)O— (ester), —C(O)NH— (amide), —OCC(O)O— (carbonate), —OH (alcohol), —SH (thiol), —NH$_2$ (amine), —NHC(O)NH— (urea), —OC(O)NH— (urethane), or —C(O)NH—C(O)— (imide).
5. The stretchable display device of claim 4, wherein the polar functional group of the substrate polymer and the sealing polymer includes a C=O functional group, and
the inorganic compound diffuses into the substrate and the sealing layer and reacts with the C=O bond to form the substrate composite.
6. The stretchable display device of claim 4, wherein the polar functional group of the substrate polymer and the sealing polymer includes an ether (—O—) functional group, and
the inorganic compound diffuses into the substrate and reacts with the ether (—O—) bond to form the substrate composite.

7. The stretchable display device of claim 4, wherein the polar functional group of the substrate polymer and the sealing polymer includes a hydroxy (—OH) functional group, and
the inorganic compound diffuses into the substrate and reacts with the hydroxy (—OH) functional group to form the substrate composite.

8. The stretchable display device of claim 4, wherein the polar functional group of the substrate polymer and the sealing polymer includes an amine (—NH$_2$) functional group, and
the inorganic compound diffuses into the substrate and reacts with the amine (—NH$_2$) functional group to form the substrate composite.

9. The stretchable display device of claim 4, wherein the polar functional group of the substrate polymer and the sealing polymer includes a thiol (—SH) functional group, and
the inorganic compound diffuses into the substrate and reacts with the thiol (—SH) functional group to form the substrate composite.

10. A stretchable display device comprising:
a stretchable substrate;
one or more pixel units sequentially arranged on the substrate;
a first sealing layer provided between the substrate and the one or more pixel units; and
a second sealing layer that covers the pixel units,
wherein the first sealing layer comprises a first sealing polymer layer having a polar functional group and an inorganic compound diffused into the first sealing polymer layer in a thickness direction thereof, and
the second sealing layer comprises a second sealing polymer layer having a polar functional group and an inorganic compound diffused into the second sealing polymer layer in a thickness direction thereof,
wherein the inorganic compound binds to the polar functional group of the first sealing polymer and the second sealing polymer.

11. The stretchable display device of claim 10, wherein the polar functional group of the first and the second sealing polymers comprises at least one of —O— (ether), —C(O)O— (ester), —C(O)NH— (amide), —OC(O)O— (carbonate), —OH (alcohol), —SH (thiol), —NH$_2$ (amine), —NHC(O)NH— (urea), —OC(O)NH— (urethane), or —C(O)NH—C(O)— (imide).

12. The stretchable display device of claim 10, wherein the substrate comprises a substrate polymer,
wherein the substrate polymer has a greater amount of a —C—C—, —C=C—, —CF$_2$—CF$_2$—, or —SiO— functional group than an amount of polar functional group.

* * * * *